(12) United States Patent
Kitajima et al.

(10) Patent No.: US 10,197,613 B2
(45) Date of Patent: Feb. 5, 2019

(54) TRANSFORMER CONNECTION PHASE DETERMINATION DEVICE, METHOD, AND PROGRAM

(71) Applicant: FUJITSU LIMITED, Kawasaki-shi, Kanagawa (JP)

(72) Inventors: Hironobu Kitajima, Kawasaki (JP); Hideyuki Kikuchi, Chigasaki (JP); Yuta Teranishi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 647 days.

(21) Appl. No.: 14/519,244

(22) Filed: Oct. 21, 2014

(65) Prior Publication Data

US 2015/0134281 A1 May 14, 2015

(30) Foreign Application Priority Data

Nov. 14, 2013 (JP) .................................. 2013-236192

(51) Int. Cl.
*G01R 31/04* (2006.01)
*G01R 21/133* (2006.01)

(52) U.S. Cl.
CPC ........... *G01R 31/04* (2013.01); *G01R 21/133* (2013.01)

(58) Field of Classification Search
CPC .................................................... G01R 31/04
See application file for complete search history.

(56) References Cited

U.S. PATENT DOCUMENTS

| | | | |
|---|---|---|---|
| 2008/0116877 A1 | 5/2008 | Giubbini et al. | |
| 2011/0153244 A1* | 6/2011 | Rocha Alves, Jr. | G01R 19/2513 702/64 |
| 2012/0221265 A1* | 8/2012 | Arya | G01R 29/18 702/61 |
| 2013/0151177 A1* | 6/2013 | Hughes | G06F 1/28 702/60 |
| 2013/0151178 A1* | 6/2013 | Jun | G01R 15/142 702/61 |
| 2014/0236506 A1* | 8/2014 | Nikovski | G01R 22/066 702/61 |

(Continued)

FOREIGN PATENT DOCUMENTS

| | | |
|---|---|---|
| JP | 2003-185693 | 7/2003 |
| JP | 2008-500519 | 1/2008 |
| JP | 2012-198033 | 10/2012 |

OTHER PUBLICATIONS

Patent Abstracts of Japan, Publication No. 2003-185693, published Jul. 3, 2003.

(Continued)

*Primary Examiner* — Manuel L Barbee
*Assistant Examiner* — Raymond L Nimox
(74) *Attorney, Agent, or Firm* — Staas & Halsey LLP

(57) ABSTRACT

A transformer connection phase determination device includes a processor that executes a procedure. The procedure includes: computing respective correlation values representing a correlation between current corresponding to power consumed by at least one consumer connected to a transformer connected to one phase corresponding to a combination of two of a plurality of power distribution lines, and line current flowing in each of the plurality of power distribution lines; and determining the phase the transformer is connected to based on the respective correlation values.

9 Claims, 7 Drawing Sheets

(56) References Cited

U.S. PATENT DOCUMENTS

2015/0094965 A1* 4/2015 Schneider ............ G01R 21/133
702/58
2015/0377939 A1* 12/2015 Ishihara ................ G01R 29/18
324/107

OTHER PUBLICATIONS

Espacenet Bibliographic data, Publication No. JP2008500519 (A), published Jan. 10, 2008.
Patent Abstracts of Japan, Publication No. 2012-198033, published Oct. 18, 2012.

* cited by examiner

FIG.6

| CONSUMER ID | TRANSFORMER ID | POWER DISTRIBUTION SECTOR ID | DATA AVAILABILITY FLAG |
|---|---|---|---|
| d1 | T1 | I1-2 | PRESENT |
| d2 | T2 | I1-2 | PRESENT |
| d3 | T2 | I1-2 | PRESENT |
| d4 | T2 | I1-2 | ABSENT |
| d5 | T3 | I1-3 | PRESENT |
| d6 | T3 | I1-3 | ABSENT |
| ⋮ | ⋮ | ⋮ | ⋮ |

FIG.7

| CONSUMER ID | ... | DATE/0:00 | DATE/0:30 | DATE/1:00 | DATE/1:30 | ... |
|---|---|---|---|---|---|---|
| d1 | 0.50 | 0.53 | 0.60 | 0.65 | 0.42 | ... |
| d2 | 0.55 | 0.65 | 0.62 | 0.71 | 0.78 | ... |
| d3 | 0.60 | 0.51 | 0.44 | 0.40 | 0.37 | ... |
| ⋮ | ⋮ | ⋮ | ⋮ | ⋮ | ⋮ | ⋮ |

FIG.8

| POWER DISTRIBUTION SECTOR ID | ... | DATE/0:00 | DATE/0:30 | DATE/1:00 | DATE/1:30 | ... |
|---|---|---|---|---|---|---|
| I1-2-a | 60 | 63 | 60 | 62 | 58 | ... |
| I1-2-b | 65 | 65 | 62 | 61 | 68 | ... |
| I1-2-c | 60 | 61 | 64 | 60 | 67 | ... |
| I1-3-a | 50 | 53 | 60 | 52 | 58 | ... |
| I1-3-b | 55 | 55 | 52 | 61 | 58 | ... |
| I1-3-c | 51 | 52 | 55 | 57 | 56 | ... |
| ⋮ | ⋮ | ⋮ | ⋮ | ⋮ | ⋮ | ⋮ |

TRANSFORMER CONNECTION PHASE DETERMINATION DEVICE, METHOD, AND PROGRAM

CROSS-REFERENCE TO RELATED APPLICATION

This application is based upon and claims the benefit of priority of the prior Japanese Patent Application No. 2013-236192, filed on Nov. 14, 2013, the entire content of which is incorporated herein by reference.

FIELD

The embodiments discussed herein are related to a transformer connection phase determination device, a transformer connection phase determination method, and a transformer connection phase determination program.

BACKGROUND

Hitherto, as technology for determining the connection phase of a transformer, there has been a proposal for a phase distinguishing device that acquires measurement values of power breakers and sensor-containing partitioning switches through breaker substations, switching substations, and a power distribution monitoring and control master station, and acquires measurement values of smart meters through an automatic meter master station. The phase distinguishing device has power distribution system configuration data, power distribution transformer device data, and consumer supply equipment data stored in a data storage section. A time segment is selected that is a period out of each the measurement periods of measurement values, for employment in distinguishing the connection phase, and then the connection phase of each of the power distribution converters is distinguished based on each of the measurement values measured in the selected time segment, and based on each of the items of data stored in the data storage section.

RELATED PATENT DOCUMENTS

Japanese Laid-Open Publication No. 2012-198033

SUMMARY

According to an aspect of the embodiments, a transformer connection phase determination device includes a memory and a processor configured to execute a procedure. The procedure includes: computing respective correlation values representing a correlation between current corresponding to power consumed by at least one consumer connected to a transformer connected to one phase corresponding to a combination of two of plural power distribution lines, and line current flowing in each of the plural power distribution lines; and determining the phase to which the transformer is connected based on each of the correlation values.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is a diagram illustrating an example of a power distribution data table;

FIG. 7 is a diagram illustrating an example of a power consumption data table; and FIG. 8 is a diagram illustrating an example of a line current data table.

DESCRIPTION OF EMBODIMENTS

Figure 1:
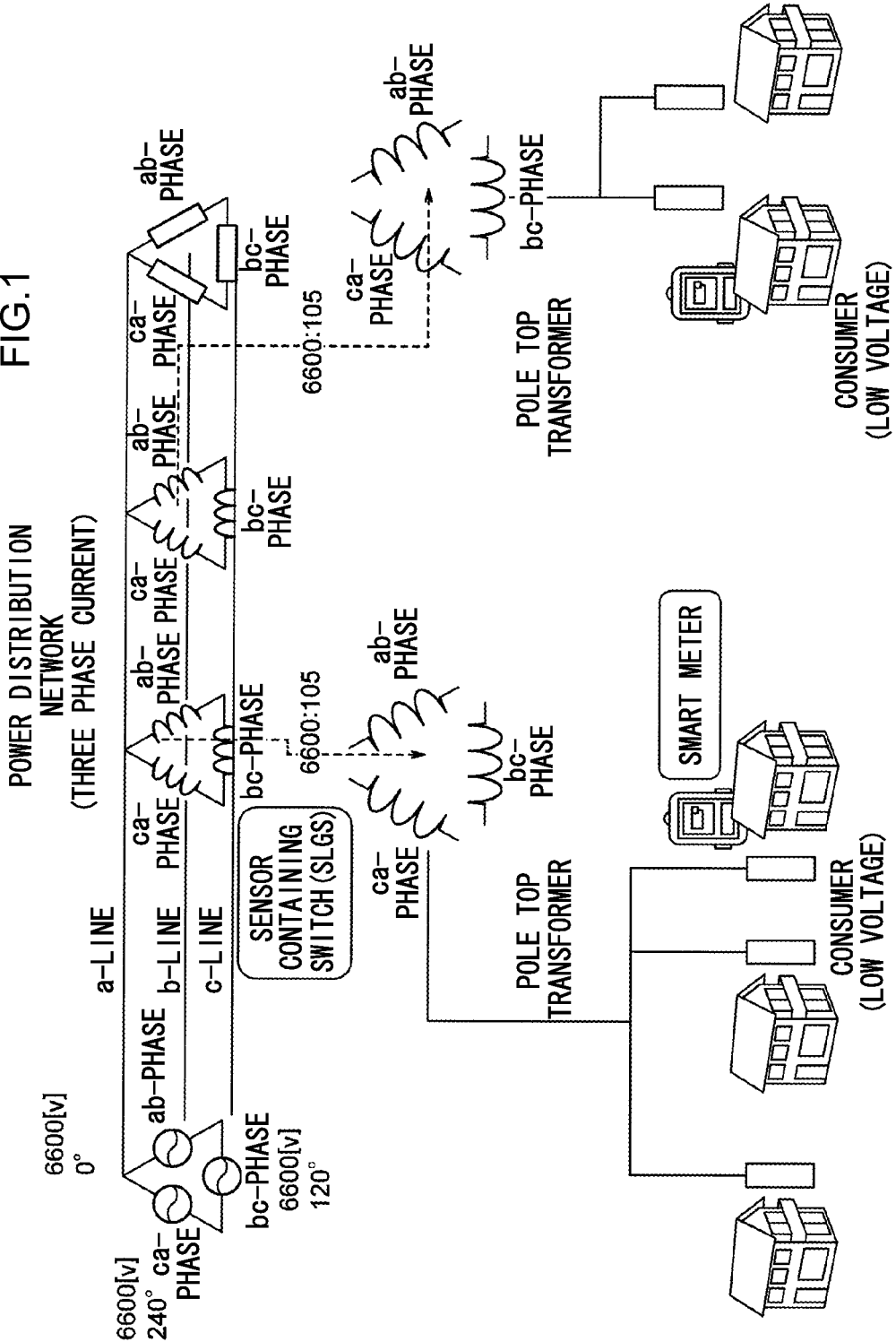
FIG. 1 is a schematic diagram illustrating an example of a power distribution network.

Detailed explanation follows regarding an exemplary embodiment according to technology disclosed herein, with reference to the drawings.

Regarding the Transformer Connection Phase Determination Problem With the opening up of the power supply market through deregulation of electricity businesses, and the proliferating trend towards renewable power, the functions required of power distribution systems acting as the power transfer means have recently been changing significantly. In such power distribution systems, there are significant issues regarding measures to address the expected large scale introduction of distributed power sources, such as solar power (photovoltaics (PV)). An example of such an issue is the need for voltage management to keep the supply voltage of power distribution systems within a fixed range (such as, for example, 101±6V, or 202±20V).

A major issue with voltage management in conventional power distribution systems is that voltage drops with excessive load; however, in distributed power source power distribution systems, since a reverse flow is generated to sell electricity, it is voltage rises that occur at such occasions that are a significant issue. Existing power distribution systems are designed and operated with the presumption of preventing voltage drops; however, issues related to voltage rises are hardly anticipated. The development of new voltage management methods, such as those utilizing various passive mechanisms and active mechanisms are being investigated in power electronics as countermeasures to such voltage rise issues.

An issue regarding the pole top transformer connection phase has surfaced during investigations into new voltage management methods. This issue is the problem, in a three phase power distribution system, of not knowing which phase the high voltage side of a given transformer at the consumer-side connection point is connected to out of the combination of 3 types of power distribution line (phases). The transformer connection phase is selected so as to achieve the best balance in load from plural consumers in order to maintain an equilibrium in three phase alternating current. However there are hardly any records held or management performed of specifically which transformer connection phase it is to which each consumer is connected. There is accordingly a need to start investigations into the application of new voltage management methods by surveying the current state of transformer connection phases.

Normally there is a single transformer installed for from 10 to 20 consumers, and if the power distribution system is considered as a whole then there are a vast number of transformers for which the connection phase needs to be determined. There is accordingly a large cost and time required if the transformer connection phases were manually determined for a whole power distribution system.

In conventional phase determination equipment technology there is a need for data regarding the power consumption of all of the consumers connected to the transformer, and it is not possible to determine the transformer connection phases if there is only usable data on electricity consumption for some of the consumers.

An object of the present exemplary embodiment is to determine the transformer connection phase even in situations in which there is only usable data on power consumption for some of the consumers connected to a transformer. More detailed explanation follows regarding the transformer connection phase determination problem underlying the present exemplary embodiment.

FIG. 1 illustrates an example of a power distribution network. In a three phase power distribution system there are 3 possibilities for the connection phase of the pole top transformer. The power distribution lines on the high voltage side (6.6 kV) are referred to here as a-line, b-line, and c-line, and possible combinations of power distribution lines for the transformer connection phase are an ab-phase, a bc-phase, and a ca-phase. Although most pole top transformers are actually single phase, the pole top transformer is illustrated with three phases to demonstrate that there plural possibilities for the connection phase. In an actual power distribution system, a transformer is normally limited to connection to a single phase, and operation is performed so as to allow load to be balanced across the three phases by allocating a given phase for each of the transformers.

At the high voltage side of the power distribution system, there are a number of sensor containing switches (SLGS) enabling measurement values to be acquired for the 3 types of line current and inter-line voltage. The consumer is connected to the secondary side of the transformer, and receives a contracted voltage (for example 100V). Power meters equipped with communication functions, such as smart meters, are being introduced to some consumers, and these continuously measure the power consumption in the consumers. Data of connection relationships between each consumer and transformer is managed by the power company; however, there are generally no records or management of data of the connection phase to which the transformer is connected.

The data of the transformer connection phase has importance for voltage management of the power distribution system; however, there is a large cost and time required to survey such data. Consideration has accordingly been given to determining the transformer connection phase based on the measurement data of the sensor containing switches and power meters on the consumer side. Specific conditions follow regarding "transformer connection phase determination problem".

The following are categories of data that can be used to determine transformer connection phases.
(1) Measurement Values of Sensor Containing Switches
   line current on the high voltage side of the power distribution system (a-line, b-line, c-line)
   line voltage on the high voltage side of the power distribution system (between lines a-b, between lines b-c, and between lines c-a).

(2) Measurement Values of Power Meters with Communication Functions
   power consumption amount of consumer (only from the portion of the consumers who have installed power meters with communication functions).
(3) Consumer Management Data
   connection relationships between each consumer and transformer (transformer connection phase unclear).

The Sensor containing switches of (1) are being introduced in existing power distribution systems, and installing from 1 to several sensor containing switches for a single feeder is practical. A feeder is a portion of a power distribution system centered on a power distribution transformer station, and a single feeder in a city normally includes consumers of about 1000 houses. The uptake of communication function equipped power meters of (2) is currently 2% or less, as of February 2012; however, installation is expected to proceed rapidly from now. The sampling interval for measuring the amount of power with power meters differs between the various types of power meter, and is, for example, a 30 minute interval. Regarding (3), there are cases in which data of the transformer connection phase utilization is also contained in addition to the data of connection relationships. For example, the connection phases of power lines are normally limited to one per transformer.

As described above, determination of the transformer connection phase based on the currently usable data is the "transformer connection phase determination problem" underlying the present exemplary embodiment.

It is generally natural to use circuit logic computation as the basis for determining connection relationships of circuits, such as transformer connection phases, from electrical data of power distribution systems. However, in usable data above, there is a distinct lack of data for performing deterministic circuit calculations. It is accordingly difficult to determine the transformer connection phase by circuit logic computation based on usable data. Determining the transformer connection phase by utilizing statistical correlation data in the usable data might be considered as the next best approach.

Considering combinations of usable data at the high voltage side and the low voltage side (consumer side) of the power distribution system, employing power data to implement a correlation analysis method is conceivable. If there is power data, then direct measurement values are obtainable from both the high voltage side and the low voltage side. Assume that it is possible to calculate power for each of the individual power distribution lines on the high voltage side, and that the power distribution lines configuring the power supply path are unique for the connection phase of the transformer to which the consumer is connected. In such cases, it is possible to determine the transformer connection phase by implementing correlation analysis of time series data of power of individual power distribution lines, against time series data of power consumption of the consumer.

However, for example as illustrated in FIG. 1, it is fundamentally difficult (for reasons given later) to determine the transformer connection phase based on a correlation analysis method using power data for a power distribution system in which each of the pole top transformers is connected to one phase out of three phases in a three phase line system. Thus in the present exemplary embodiment, the transformer connection phase is determined by correlation analysis using current data rather than power data.

Configuration of Transformer Connection Phase Determination Device

Figure 2:
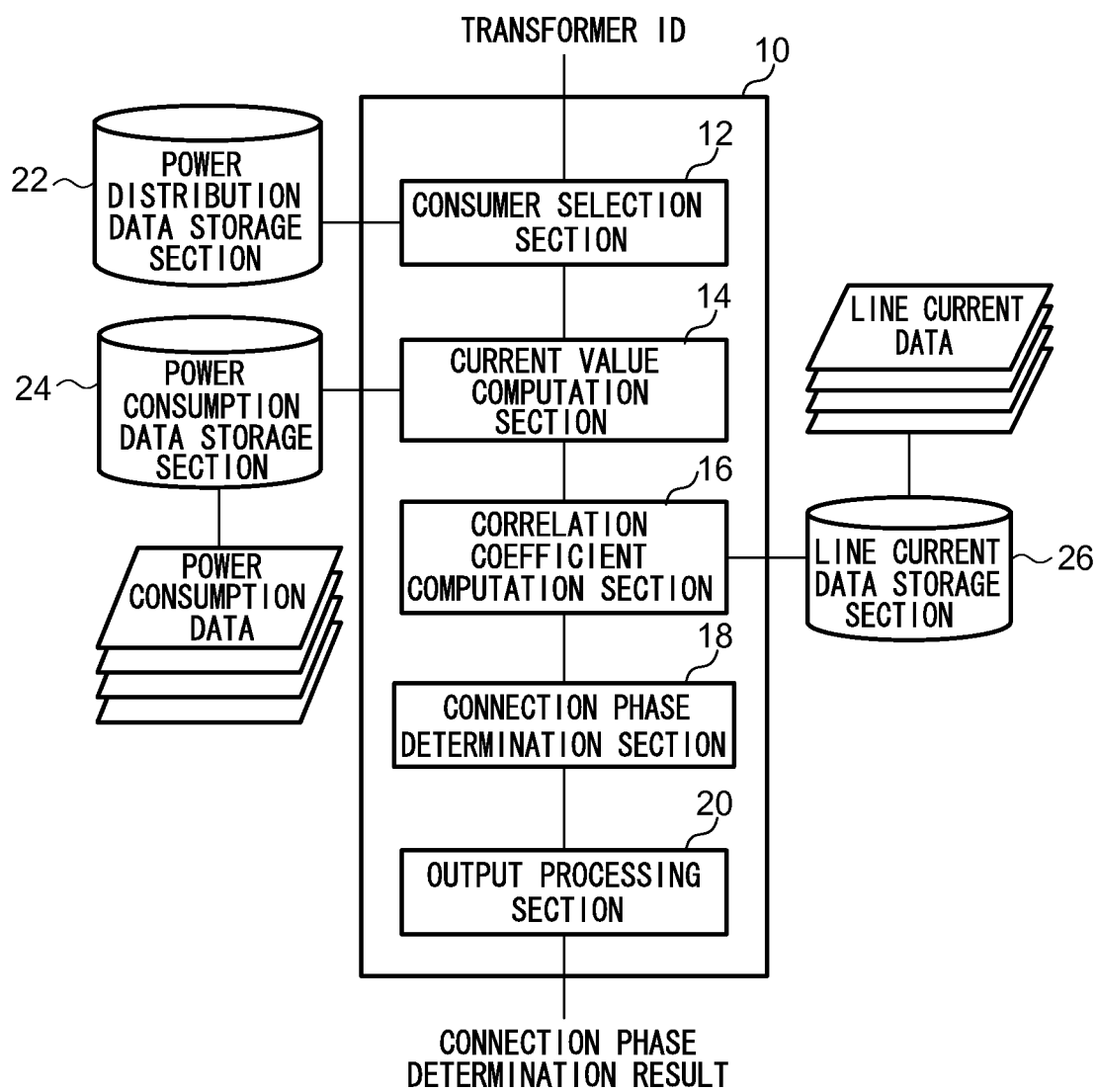
FIG. 2 is a block diagram representing a schematic configuration of a transformer connection phase determination device according to an exemplary embodiment.

As illustrated in FIG. 2, the transformer connection phase determination device 10 according to the present exemplary embodiment includes a consumer selection section 12, a current value computation section 14, a correlation coefficient computation section 16, a connection phase determination section 18, and an output processing section 20.

The consumer selection section 12 receives as an input a transformer ID indicating the transformer for which connection phase determination is being performed, and selects a power distribution sector and consumer corresponding to the transformer ID.

Figure 3:
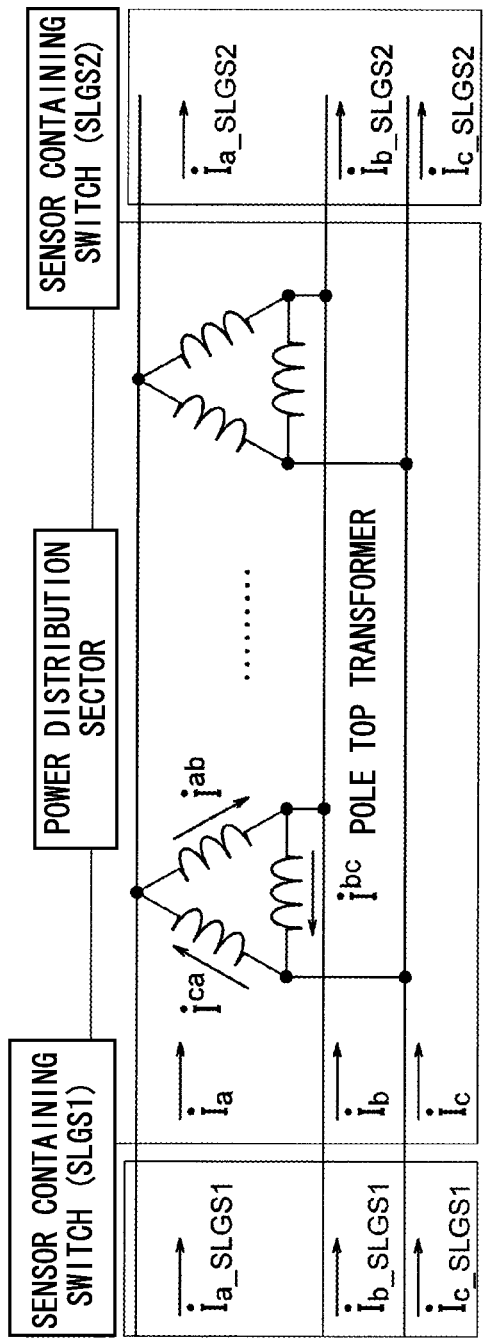
FIG. 3 is a schematic diagram illustrating a power distribution system as a hypothetical circuit configuration.

More specifically, for example, consider a power distribution system such as that illustrated in FIG. 3. The example in FIG. 3 is a three phase line circuit, in which the transformers are three phase transformers that form hypothetical triangular connection. Most pole top transformers in actual power distribution systems employ a single phase three line system, and normally employ only a single phase; however, in FIG. 3, in order to be able to handle plural possibilities of connection phase, the power distribution system is illustrated as a hypothetical circuit configuration. In the present exemplary embodiment, the sector sandwiched between two sensor containing switches is annotated "power distribution sector". The consumer is connected to the secondary side of the transformer.

The correspondence relationship between power distribution sectors and the transformers belonging to the power distribution sectors, and the correspondence relationship between transformers and the consumers connected to the transformers, are stored as power distribution data in a power distribution data storage section 22. The consumer selection section 12 references power distribution data stored in the power distribution data storage section 22 and selects a power distribution sector and a consumer corresponding to the received transformer ID.

The current value computation section 14 reads time series data of power consumption of the selected consumer, and converts the power consumption time series data into time series data of current values. The power consumption time series data of the consumers may, for example, employ data determined by power meters with communication functions, such as smart meters, installed in the consumer. The power consumption of the consumer is measured over, for example, intervals of 30 minutes, and is stored in the power consumption data storage section 24 as time series data of power consumption for each of the consumers.

The correlation coefficient computation section 16 reads the time series data of line current in the selected power distribution sector and computes the correlation coefficient against the current value time series data computed by the current value computation section 14. The line current time series data may be derived from the current values determined by the sensor containing switches that define the two ends of the power distribution sector. In the present exemplary embodiment, as illustrated in FIG. 3, since a three phase line circuit is assumed, the correlation coefficient computation section 16 derives line current time series data for each line (a-line, b-line, and c-line) of the high voltage side of the power distribution system. Then the correlation coefficient computation section 16 computes three types of correlation coefficient between the current value time series data corresponding to the power consumption of the consumer, and the line current time series data of each of the lines a-line, b-line, and c-line.

The connection phase determination section 18 determines which phase the subject transformer is connected to on the high voltage side based on the 3 types of correlation coefficient computed by the correlation coefficient computation section 16. More detailed explanation follows regarding the determination method.

The output processing section 20 processes the determination result by the connection phase determination section 18 for displaying on a display, or printing on a printer, or the like, and outputs the determination result.

Explanation follows regarding the principles that enable the transformer connection phase to be determined based on the correlation coefficients between the line current time series data of each of the lines on the high voltage side of the power distribution system, and the current value time series data corresponding to the power consumption of the consumer.

When power is consumed by the consumer connected to the secondary side of the transformer, phase current also flows on the primary side of the transformer. It is possible to measure the current flowing in each of the lines on the high voltage side using the sensor containing switches, as described above.

As illustrated in FIG. 3, the net (complex) line current $I(\bullet)_x$ flowing into one power distribution sector, and the relationship between each of the line currents $I(\bullet)_x$ and the phase current $I(\bullet)_i^y$ are expressed by the following Equation (1) using Kirchhoff's law. Wherein $I(\bullet)$ is represented in the formula by adding a dot ("$\bullet$") above a letter ("I").

$$\begin{cases} \dot{I}_a = \dot{I}_{a\_SLGS1} - \dot{I}_{a\_SLGS2} \\ \dot{I}_b = \dot{I}_{b\_SLGS1} - \dot{I}_{b\_SLGS2} \\ \dot{I}_c = \dot{I}_{c\_SLGS1} - \dot{I}_{c\_SLGS2} \end{cases} \quad (1)$$

$$\begin{cases} \dot{I}_a = \dot{I}^{ab} - \dot{I}^{ca} = \sum_i \dot{I}_i^{ab} - \sum_k \dot{I}_k^{ca} \\ \dot{I}_b = \dot{I}^{bc} - \dot{I}^{ab} = \sum_j \dot{I}_j^{bc} - \sum_i \dot{I}_i^{ab} \\ \dot{I}_c = \dot{I}^{ca} - \dot{I}^{bc} = \sum_k \dot{I}_k^{ca} - \sum_j \dot{I}_j^{bc} \end{cases}$$

$(1 \le i \le n_{ab}, 1 \le j \le n_{bc}, 1 \le k \le n_{ca})$

Wherein $x \in \{a, b, c\}$ for $I(\bullet)_x$, and is the (complex) current flowing in line x on the high voltage side. $I(\bullet)_{x\_SLGS1}$ and $I(\bullet)_{x\_SLGS2}$ are current values measured at each of the respective sensor containing switches disposed at the two ends of line x. $y \in \{ab, bc, ca\}$ for $I(\bullet)^y$, and $I(\bullet)^y$ is the phase current of the y phase of the transformer. $y \in \{ab, bc, ca\}$ for $I(\bullet)_i^y$, and $I(\bullet)_i^y$ is the phase current of the y phase caused by the power consumption of the $i^{th}$ consumer. $n_y$ is the consumer connected to the y phase.

As can be seen from Equation (1), in the circuit illustrated in FIG. 3, there is a 1 to 2 relationship between the phase current of the transformer and the line current of the power distribution line, and the power consumption of the consumer influences two lines out of the 3 power distribution lines. Even in cases in which the consumer is connected to a transformer connected to one of the phases, one line out of two lines is redundant, and so the power data is not independent between the high voltage side and the low voltage side (consumer side), and so connection phase determination by correlation analysis is not appropriate.

In contrast thereto, for current, a phase current and a line current are independently present as a combination. For example, it can be seen from Equation (1) that the phase current $I(\bullet)_i^{ab}$ of the ab phase caused by power consumption of a consumer connected to the ab phase is unrelated to the line current $I(\bullet)_c$. There are also similar independent combinations present for the relationships between the other phase currents and line currents. It is accordingly possible to determine the transformer connection phase as long as the differences in such correlation can be estimated by statistical analysis. Explanation next follows regarding determination of transformer connection phase by correlation analysis using current data.

As stated above, the high voltage side of the power distribution system is configured by a three phase three line system with a phase difference of $2\pi/3$ between each of the phase currents. If the latter part of Equation (1) is expressed by phase current broken down into amplitude and phase, this results in the following Equation (2).

$$\dot{I}_a = \sum_i I_i^{ab} - e^{j\frac{2}{3}\pi} \sum_k I_k^{ca} \qquad (2)$$

$$\dot{I}_b = e^{-j\frac{2}{3}\pi} \sum_j I_j^{bc} - \sum_i I_i^{ab}$$

$$\dot{I}_c = e^{j\frac{2}{3}\pi} \sum_k I_k^{ca} - e^{-j\frac{2}{3}\pi} \sum_j I_j^{bc}$$

$$I_x = |\dot{I}_x|,$$

$$x \in \{a, b, c\}$$

$$I_i^y = |\dot{I}_i^y|,$$

$$y \in \{ab, bc, ca\}$$

The amplitude of the phase current may be obtained by adding the real component values for the same phase, and so may be compiled by following Equation (3).

$$I^y = \left|\sum_i \dot{I}_i^y\right| \qquad (3)$$

$$= \sum_i |\dot{I}_i^y|$$

$$= \sum_i I_i^y$$

The following Equation (4) uses Equation (2) and Equation (3) and expresses the amplitude of the line current of the a-line as phase current.

$$I_a = |\dot{I}_a| \qquad (4)$$

$$= \left|\sum_i I_i^{ab} - e^{j\frac{2}{3}\pi} \sum_k I_k^{ca}\right|$$

Assuming the power distribution system has symmetrical three phase alternating current, then the amplitude of the line current of the a-line is expressed by following Equation (5). Note that the symmetrical three phase alternating current has equal electromotive force and frequency for the three phases, and the phase differences are all $2\pi/3$.

$$I_a = \sqrt{(I^{ab})^2 + (I^{ca})^2 - 2I^{ab}I^{ca}\cos\frac{2\pi}{3}} \qquad (5)$$

$$= \sqrt{(I^{ab})^2 + (I^{ca})^2 + I^{ab}I^{ca}}$$

Taking the first order Taylor expansion approximation of Equation (5), the relationship between the line current of the a-line, and the rate of instantaneous change in the phase current of phase ab and the phase current of phase ca can be expressed by the following Equation (6).

$$dI_a \sim \frac{2I^{ab} + I^{ca}}{2\sqrt{(I^{ab})^2 + (I^{ca})^2 + I^{ab}I^{ca}}} dI^{ab} + \frac{2I^{ca} + I^{ab}}{2\sqrt{(I^{ab})^2 + (I^{ca})^2 + I^{ab}I^{ca}}} dI^{ca} \qquad (6)$$

Moreover, assuming the load impedance connected to each phase has the same equilibrium load, then from $I^{ab}=I^{ca}$, a linear approximation is obtained as the following Equation (7) for the rate of instantaneous change from a state of equilibrium.

$$dI_a \sim \frac{\sqrt{3}}{2} dI^{ab} + \frac{\sqrt{3}}{2} dI^{ca} \qquad (7)$$

Since it is possible to derive the same approximations for the other line currents, the rate of instantaneous change of line current can be estimated by the 3 approximations of the following Equation (8).

$$\begin{cases} dI_a \sim \frac{\sqrt{3}}{2}(dI^{ab} + dI^{ca}) \\ dI_b \sim \frac{\sqrt{3}}{2}(dI^{bc} + dI^{ab}) \\ dI_c \sim \frac{\sqrt{3}}{2}(dI^{ca} + dI^{bc}) \end{cases} \qquad (8)$$

In order to apply correlation analysis to current data, time series data of line current $I_x(t)$, and time series data of phase current $I_d^y(t)$ is defined by the following Equation (9-1). In Equation (9-1), values expressing displacement from the time averages of measurement values $I'_x(t)$ of the line current, and measurement values $I'_d{}^y(t)$ of the phase current are respectively employed as $I_x(t)$, and $I_d{}^y(t)$.

$$I_x(t)=I'_x(t)-\mu(I'_x(t)), x\in\{a,b,c\}$$

$$I_d{}^y(t)=I'_d{}^y(t)-\mu(I'_d{}^y(t)), y\in\{ab,bc,ca\} \qquad (9\text{-}1)$$

($\mu(\bullet)$ is the time average)

For a given phase, the amplitude of the line current may be treated as a real number when deriving the net line current $I'_x(t)$ flowing in each power distribution sector as illustrated in FIG. 3 from measurement values of the sensor containing switches. Then, as in the following Equation (9-2), the line current $I'_x(t)$ is obtained by subtracting the measurement value in the downstream sensor containing switch (SLGS2) from the measurement value in the upstream sensor containing switch (SLGS1).

$$I'_x(t)=I'_{x\_SLGS1}(t)-I'_{x\_SLGS2}(t), x\in\{a,b,c\} \qquad (9\text{-}2)$$

In Equation (9-1), the phase current $I'_d{}^y(t)$ caused by power consumption of the consumer d connected to phase y of the transformer may be computed from the amount of power consumption measured by the power meter using the following Equation (10). In such cases, the contracted voltage is employed as a constant for the voltage value. The current value computed from the consumed power in the consumer measured by the power meter and from the contracted voltage (real number value) is a real number, and so is expressed in terms of $\sqrt{2}$ to derive the amplitude (maximum value) in Equation (10). The current value computed in Equation (10) only has the meaning of the average current amount over the sampling interval of the power meter, and so there is no problem in implementing statistical analysis as long as the line current is also subjected to equivalent processing.

$$I'^{y}_{d}(t) = \frac{\sqrt{2}}{k} \cdot \frac{P_d(t)}{V_d} \quad (10)$$

For $P_d(t)$ in the time series data of power consumption of the consumer d, $V_d$ is the contracted voltage (real component value) of consumer d, and k is the transformer ratio.

The covariance $\sigma^{y}_{x,d}$ and the correlation coefficient $\rho^{y}_{x,d}$ between the time series data of each line current $I_x(t)$ and the time series data of each phase current $i^{y}_{d}(t)$ may be defined by the following Equation (11).

$$\sigma^{y}_{x,d} = \frac{1}{T}\sum_{t=1}^{T} I_x(t)I^{y}_{d}(t) \quad (11)$$

$$\rho^{y}_{x,d} = \frac{\sigma^{y}_{x,d}}{\sigma_x \sigma^{y}_{d}}$$

$$= \frac{\frac{1}{T}\sum_{t=1}^{T} I_x(t)I^{y}_{d}(t)}{\sqrt{\frac{1}{T}\sum_{t=1}^{T} I_x(t)^2} \sqrt{\frac{1}{T}\sum_{t=1}^{T} I^{y}_{d}(t)^2}}$$

$$(-1 \le \rho^{y}_{x,d} \le 1)$$

Wherein $\sigma_x$ is the deviation in $I_x(t)$, $\sigma^{y}_{d}$ is the deviation in $I^{y}_{d}(t)$, and T is the number of sampling points in the time series data.

There are 3×3=9 correlation coefficients and covariances defined in Equation (11) by combining the subscripts x and y. The specific actual values held by these correlation coefficients are determined by changes with time in the power consumption of each of the consumers, and how the transformer connection phases that define the relationship between the line current and the phase current are set.

Explanation follows regarding values of correlation coefficients when appropriate assumptions are made for the time series data of power consumption. Application of Equation (8) enables the time series data of values of each of the line currents to be approximated by the following Equation (12).

$$\begin{cases} I_a(t) \sim \frac{\sqrt{3}}{2}\left(\sum_i I^{ab}_i(t) + \sum_k I^{ca}_k(t)\right) \\ I_b(t) \sim \frac{\sqrt{3}}{2}\left(\sum_j I^{bc}_j(t) + \sum_i I^{ab}_i(t)\right) \\ I_c(t) \sim \frac{\sqrt{3}}{2}\left(\sum_k I^{ca}_k(t) + \sum_j I^{bc}_j(t)\right) \end{cases} \quad (12)$$

$$I^{y}_{i}(t) = I'^{y}_{i}(t) - \mu(I'^{y}_{i}(t)),$$

$$y \in \{ab, bc, ca\}$$

($\mu(\cdot)$ は時間平均)
($\mu(\cdot)$ is the time average)

Assume the phase current $I^{y}_{i}(t)$ caused by power consumption in each of all the consumers including consumer d follow mutually independent normal distributions N (0, $\sigma_0^2$). First, the deviation $\sigma_x$ in the time series data of each of the line currents $I_x(t)$, and the covariance $\sigma^{ab}_{x,d}$ between the line current $I_x(t)$ and the phase current $i^{ab}_{d}(t)$ in cases in which the consumer d is connected to the phase ab, are given by the following Equation (13), derived from Equation (11) and Equation (12).

$$\begin{cases} \sigma_a \sim \frac{\sqrt{3}}{2} \cdot \sqrt{n_{ab} + n_{ca}} \cdot \sigma_0 \\ \sigma_b \sim \frac{\sqrt{3}}{2} \cdot \sqrt{n_{bc} + n_{ab}} \cdot \sigma_0 \\ \sigma_c \sim \frac{\sqrt{3}}{2} \cdot \sqrt{n_{ca} + n_{bc}} \cdot \sigma_0 \end{cases} \quad (13)$$

$$\begin{cases} \sigma^{ab}_{a,d} = \frac{1}{T}\sum_{t=1}^{T} I_a(t)I^{ab}_d(t) \\ \quad \sim \frac{1}{T}\sum_{t=1}^{T}\left[\frac{\sqrt{3}}{2}\left(\sum_i I^{ab}_i(t) + \sum_k I^{ca}_k(t)\right)I^{ab}_d(t)\right] \\ \quad = \frac{\sqrt{3}}{2}\sigma_0^2 \\ \sigma^{ab}_{b,d} = \frac{1}{T}\sum_{t=1}^{T} I_b(t)I^{ab}_d(t) \\ \quad \sim \frac{1}{T}\sum_{t=1}^{T}\left[\frac{\sqrt{3}}{2}\left(\sum_j I^{bc}_j(t) + \sum_i I^{ab}_i(t)\right)I^{ab}_d(t)\right] \\ \quad = \frac{\sqrt{3}}{2}\sigma_0^2 \\ \sigma^{ab}_{c,d} = \frac{1}{T}\sum_{t=1}^{T} I_c(t)I^{ab}_d(t) \\ \quad \sim \frac{1}{T}\sum_{t=1}^{T}\left[\frac{\sqrt{3}}{2}\left(\sum_k I^{ca}_k(t) + \sum_j I^{bc}_j(t)\right)I^{ab}_d(t)\right] \\ \quad = 0 \end{cases}$$

The result of the latter part in Equations (13) is obtained from the condition that the phase current $I^{ab}_d(t)$ of the phase ab caused by power consumption of the consumer d correlates only to the portion of the line current caused by the phase current itself. If the result is substituted into the definition of the correlation coefficient, then in a case in which the consumer d is connected to phase ab, the correlation coefficient between each of the line currents and the phase current of the phase ab can be derived as illustrated in the following Equation (14).

$$\begin{cases} \rho_{a,d}^{ab} = \dfrac{\sigma_{a,d}^{ab}}{\sigma_a \sigma_d^{ab}} \\ \quad \sim \dfrac{\dfrac{\sqrt{3}}{2}\sigma_0^2}{\left(\dfrac{\sqrt{3}}{2} \cdot \sqrt{n_{ab}+n_{ca}} \cdot \sigma_0\right) \cdot \sigma_0} \\ \quad = 1/\sqrt{n_{ab}+n_{ca}} \\ \rho_{b,d}^{ab} = \dfrac{\sigma_{b,d}^{ab}}{\sigma_b \sigma_d^{ab}} \\ \quad \sim \dfrac{\dfrac{\sqrt{3}}{2}\sigma_0^2}{\left(\dfrac{\sqrt{3}}{2} \cdot \sqrt{n_{bc}+n_{ab}} \cdot \sigma_0\right) \cdot \sigma_0} \\ \quad = 1/\sqrt{n_{bc}+n_{ab}} \\ \rho_{c,d}^{ab} = \dfrac{\sigma_{c,d}^{ab}}{\sigma_c \sigma_d^{ab}} \sim 0 \end{cases} \quad (14)$$

Similar computations are also possible for cases in which the consumer d is connected to the other phases. The following Equations (15) are approximate equations for the correlation coefficients between each of the line currents and phase currents by connection phase of the consumer d.

$$\rho_{a,d}^{y} \sim \begin{cases} 1/\sqrt{n_{ab}+n_{ca}} & (y=ab, ca) \\ 0 & (y=bc) \end{cases} \quad (15)$$

$$\rho_{b,d}^{y} \sim \begin{cases} 1/\sqrt{n_{bc}+n_{ab}} & (y=ab, bc) \\ 0 & (y=ca) \end{cases}$$

$$\rho_{c,d}^{y} \sim \begin{cases} 1/\sqrt{n_{ca}+n_{bc}} & (y=bc, ca) \\ 0 & (y=ab) \end{cases}$$

As illustrated in Equation (15), there is a one-to-one correspondence between the transformer connection phase to which the consumer d is connected, and type of correlation coefficient that approximates to a value of 0. The correlation coefficients that do not have a value approximating to 0 hold values dependent on the distribution of each of the connection phases for all the consumers.

Up to now calculation has proceeded on the assumption that there is a single consumer d; however, when there is usable data for power consumption for plural consumers connected to the same transformer, it is possible to improve the precision of determination of the transformer connection phase.

Specifically, the total consumed power amount is acquired for each of the consumers for every measurement time, enabling an improvement to be achieved in the determination precision of the transformer connection phase by treating the acquired total as consumed power for a large hypothetical consumer. For example, take a case in which it is possible, for example, to use time series data for power consumption of consumers for $n_d$ households. Moreover, the distribution of phase current caused by the power consumption of this hypothetical consumer follows a normal distribution of N (0, $n_d\sigma_0^2$). In such cases, the approximations of correlation coefficient may be replaced as in following Equations (16) and the difference in the correlation coefficients changes in proportion to the $n_d$.

$$\rho_{a,d}^{y} \sim \begin{cases} \sqrt{\dfrac{n_d}{n_{ab}+n_{ca}}} & (y=ab, ca) \\ 0 & (y=bc) \end{cases} \quad (16)$$

$$\rho_{b,d}^{y} \sim \begin{cases} \sqrt{\dfrac{n_d}{n_{bc}+n_{ab}}} & (y=ab, bc) \\ 0 & (y=ca) \end{cases}$$

$$\rho_{c,d}^{y} \sim \begin{cases} \sqrt{\dfrac{n_d}{n_{ca}+n_{bc}}} & (y=bc, ca) \\ 0 & (y=ab) \end{cases}$$

The actual phase current is not limited to one with a normal distribution such as is assumed above. However similarly, even in general cases, from out of the 3 types of correlation coefficient, the one correlation coefficient present that has a smaller value compared to the others corresponds to the connection phase of the transformer. Focusing on this fact enables the correlation coefficients of the time series data of the line current for each of the lines on the high voltage side of the power distribution system, against the time series data of the phase current caused by power consumption by the consumer, to be calculated, and enables the transformer connection phase to which the consumer is detected to be determined by comparison therebetween.

Explanation follows regarding the precision of the transformer connection phase determination problem using correlation coefficients. In a three phase alternating current power distribution system, connection lines are generally employed so as to obtain a balance of load in the three phases in order to achieve good power transmission efficiency. If the total number of consumers of a power distribution sector subject to determination is N, then assume a relationship has been established in which $n_{ab}=n_{bc}=n_{ca}=N/3$. In such a case, the change in amplitude of the correlation coefficients for each of the line currents given by Equation (16) is approximately as represented by following Equation (17). If Equation (17) is used as an index, then it is possible to estimate the difficulty of the determination problem according to the conditions of data employed.

$$\Delta\rho \sim \sqrt{\dfrac{3n_d}{2N}} \quad (17)$$

Figure 4:
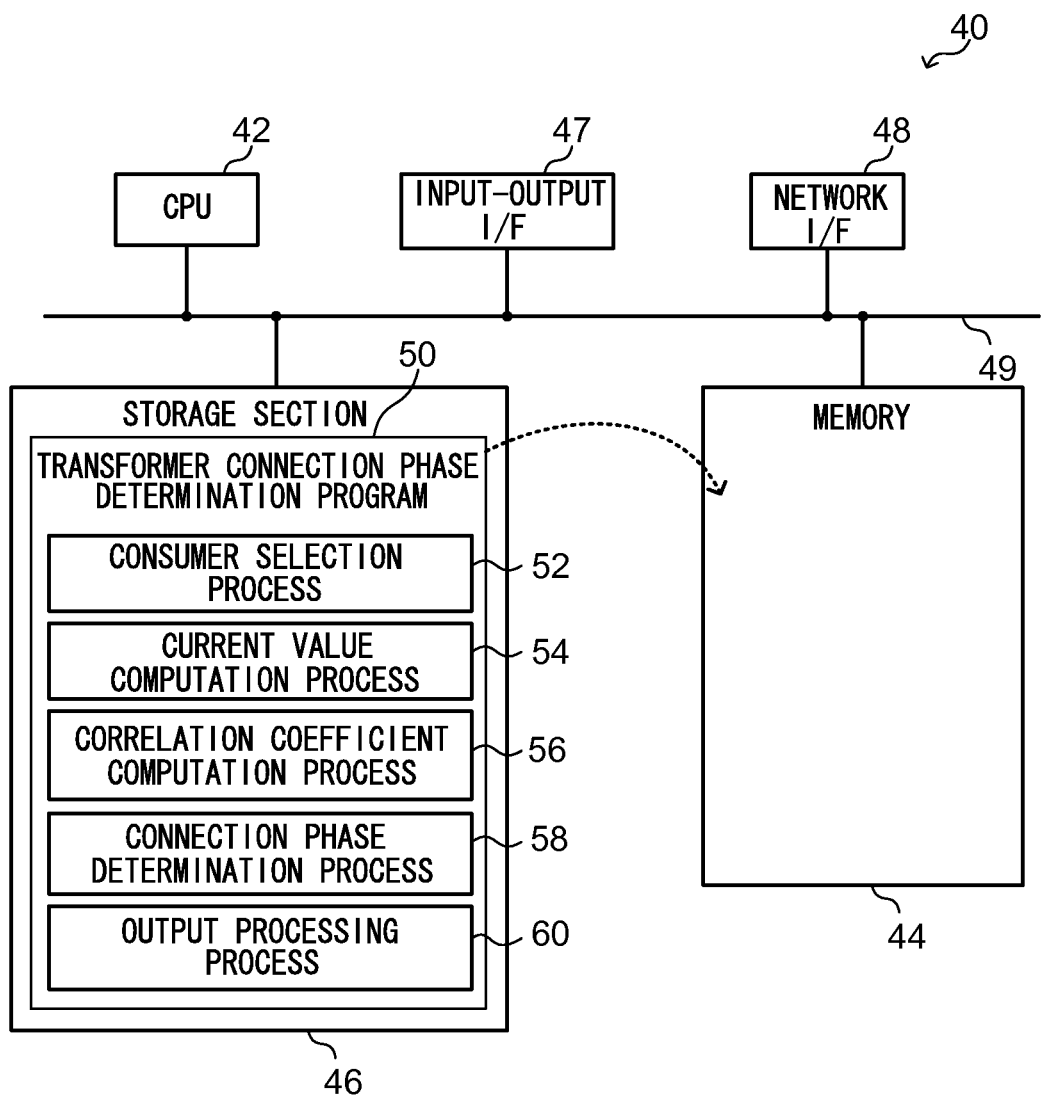
FIG. 4 is a block diagram illustrating a schematic configuration of a computer that functions as a transformer connection phase determination device according to the present exemplary embodiment.

The transformer connection phase determination device 10 is capable of, for example, being implemented by a computer 40 as illustrated in FIG. 4. The computer 40 includes a CPU 42, memory 44, a non-volatile storage section 46, an input/output interface (I/F) 47, and a network I/F 48. The CPU 42, the memory 44, the storage section 46, the input/output I/F 47, and the network I/F 48 are connected together through a bus 49.

The storage section 46 may be implemented by a Hard Disk Drive (HDD), flash memory, or the like. A transformer connection phase determination program 50 to cause the computer 40 to function as the transformer connection phase determination device 10 is stored on the storage section 46 as a storage medium. The CPU 42 reads the transformer connection phase determination program 50 from the storage section 46, expands the transformer connection phase determination program 50 in the memory 44, and sequentially executes the processes of the transformer connection phase determination program 50.

The transformer connection phase determination program 50 includes a consumer selection process 52, a current value computation process 54, a correlation coefficient computation process 56, a connection phase determination process 58, and an output processing process 60. The CPU 42 operates as the consumer selection section 12 illustrated in FIG. 2 by executing the consumer selection process 52. The CPU 42 operates as the current value computation section 14 illustrated in FIG. 2 by executing the current value computation process 54. The CPU 42 operates as the correlation coefficient computation section 16 illustrated in FIG. 2 by executing the correlation coefficient computation process 56. The CPU 42 operates as the connection phase determination section 18 illustrated in FIG. 2 by executing the connection phase determination process 58. The CPU 42 operates as the output processing section 20 illustrated in FIG. 2 by executing the output processing process 60. The computer 40 that executes the transformer connection phase determination program 50 accordingly functions as the transformer connection phase determination device 10.

Note that the transformer connection phase determination device 10 may be implemented with, for example, a semiconductor integrated circuit, and more specifically with an Application Specific Integrated Circuit (ASIC) or the like.

Operation of the Transformer Connection Phase Determination Device Explanation follows regarding operation of the transformer connection phase determination device 10 according to the present exemplary embodiment. When a transformer ID, indicating a transformer subject to connection phase determination, has been input to the transformer connection phase determination device 10, the transformer connection phase determination process illustrated in FIG. 5 is executed in the transformer connection phase determination device 10.

Figure 5:
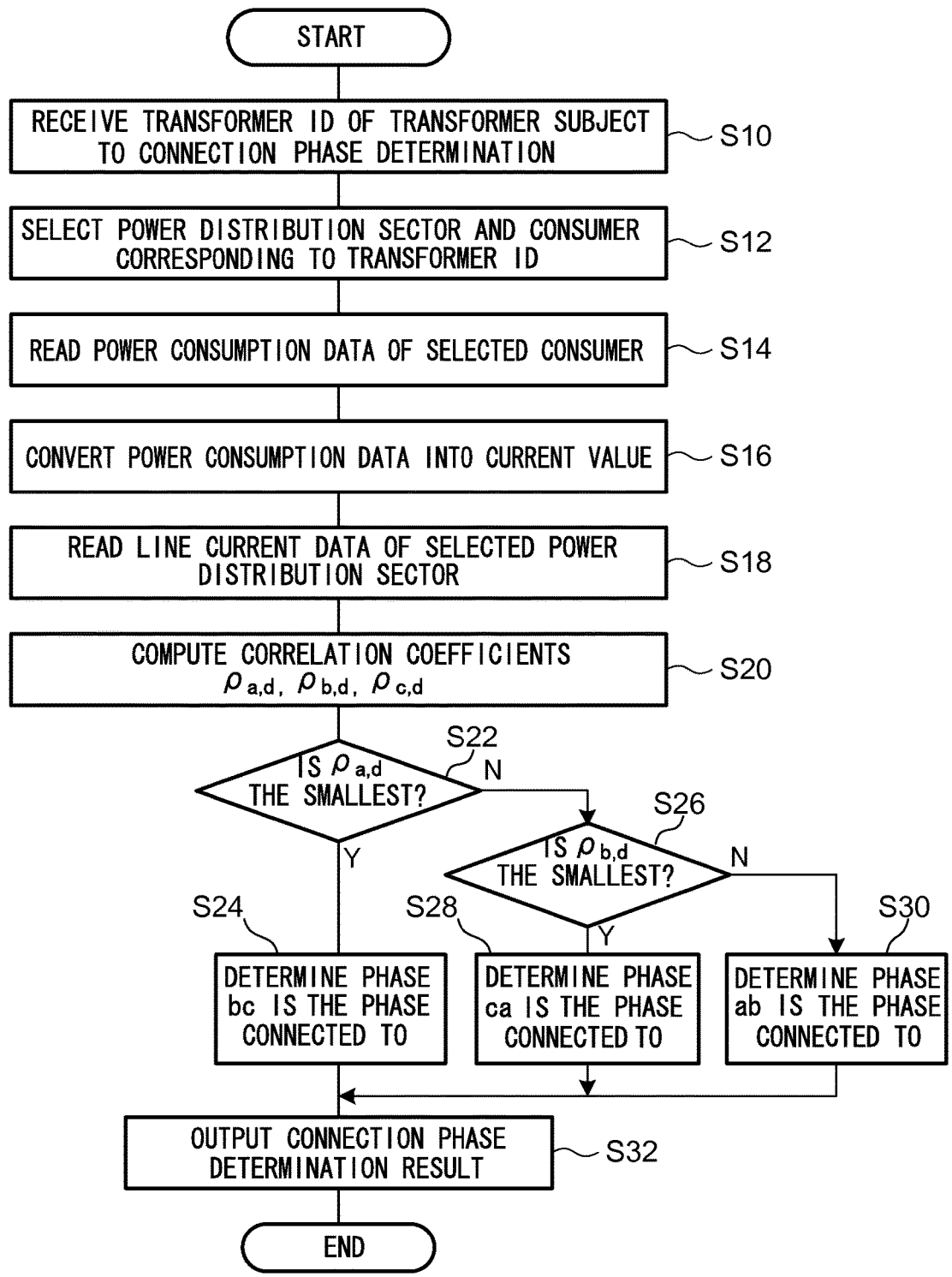
FIG. 5 is a flowchart illustrating an example of transformer connection phase determination processing in the present exemplary embodiment.

At step S10 of the transformer connection phase determination process illustrated in FIG. 5, the consumer selection section 12 receives the input transformer ID.

Then at step S12, the consumer selection section 12 selects the power distribution sector and consumers corresponding to the transformer ID received from the power distribution data storage section 22. A power distribution data table, for example such as that illustrated in FIG. 6, is stored in the power distribution data storage section 22. For each consumer, a consumer ID indicating the consumer, the transformer ID indicating the transformer to which the consumer is connected, and the power distribution sector ID indicting the power distribution sector to which the transformer belongs are stored corresponding in the power distribution table of FIG. 6. In this case, as illustrated in FIG. 3, the power distribution system is envisaged as a power distribution system in which there are plural power distribution sectors, sandwiched between the sensor containing switches disposed at the upstream side and the downstream side of the power distribution system, all connected together in series. Then, for example, a power distribution sector ID indicating the power distribution sector sandwiched between the sensor containing switch (SLGS1) and the sensor containing switch (SLGS2) is defined as "I1-2". The power distribution data table of FIG. 6 includes a data availability flag indicating whether or not power consumption data for each of the consumer is usable. For example, if the power meter installed at the consumer, such as a smart meter, is connected through a network to the transformer connection phase determination device 10, then the power consumption data of that consumer is usable, and the data availability flag is set at "present".

The consumer selection section 12 thus selects the consumer ID and the power distribution sector ID corresponding to the transformer ID that matches the transformer ID received at step S10. Note that when the consumer ID is selected, consumer IDs with "present" as the data availability flag are selected. The consumer ID acquires plural consumer IDs if there are plural applicable consumer IDs present.

Then at step S14, the current value computation section 14 reads the power consumption data corresponding to the consumer ID selected at step S12, from the power consumption data storage section 24. A power consumption data table such as that illustrated in FIG. 7 is stored in the power consumption data storage section 24. The power consumption data table of FIG. 7 has amounts of power consumption (kWh) measured by a smart meter at fixed sampling time intervals (30 minutes in the example of FIG. 7) accumulated as time series data of power consumption for each consumer.

If the consumer ID selected at step S12 is for one household, then the power consumption data corresponding to that consumer ID may be read from the power consumption data table as is. For example, in the example of FIG. 6 and FIG. 7, if transformer ID=T1 is input, then since only consumer ID=d1 is selected, the power consumption data corresponding to consumer ID=d1 is read from the power consumption data table as is.

Moreover, if plural consumer IDs have been selected at step S12, then plural sets of power consumption data corresponding to the plural consumer IDs are read. The power consumption amounts for each of the sampling times are then added together for the plural sets of power consumption data, and power consumption data is generated for a hypothetical consumer.

For example, in the example in FIG. 6 and FIG. 7, if transformer ID=T2 has been input, then the consumer IDs=d2, d3 are selected. Note that d4 is not selected since it has a data availability flag of "absent". The power consumption data corresponding to consumer ID=d2, and the power consumption data corresponding to consumer ID=d3, are then read from the power consumption data table. Then power consumption data for a hypothetical consumer, of the power consumption amount for "0:00"=0.65+0.51=1.16, and the power consumption amount for "0:30"=0.62+0.44=1.06, and so on, is generated. This thereby results in power consumption data with an improved S/N ratio, compared to employing power consumption data corresponding to each individual consumer ID without further processing, and raises the precision of correlation coefficient computed in final stage processing.

Then at step S16, the current value computation section 14 converts the power consumption data read at step S14, or the generated hypothetical consumer power consumption data, into current values using Equation (10).

Next, at step S18, the correlation coefficient computation section 16 reads, from a line current data storage section 26, the three types of line current in the power distribution sector indicated by the power distribution sector ID selected at step S12. The line current data table, like that illustrated in FIG. 8 for example, is stored in the line current data storage section 26. The line current data table of FIG. 8 has a net current value [A] measured at fixed sampling time intervals (30 minutes in the example of FIG. 8) accumulated as time series data of line current for each of the a-line, the b-line, and the c-line of the power distribution sector indicated by the power distribution sector ID. The current values of the line currents employ current values measured by the sensor containing switches disposed at the two ends of the power distribution sector, and may employ values computed according to Equation (9-2).

Next, at step S20, the correlation coefficient computation section 16 employs the phase current caused by the power consumption of the consumer converted at step S16, and the line current read at step S18, and computes the three types of correlation coefficient indicated in Equation (11). Since the connection phase of the consumer is still unknown, the superscript variable y of Equation (11) is ignored. More specifically, the phase current caused by the power consumption of the consumer is taken as $I'_d(t)$ of Equation (10), and the line current of the three types of line current are taken as $I'_x(t)$ of Equation (9-2), where $x \in \{a, b, c\}$. Since $I_d(t)$, $I_x(t)$, where $x \in \{a, b, c\}$ can be computed as a displacement from the average values of Equation (9-1), the correlation coefficients $\rho_{a,d}$, $\rho_{b,d}$, and $\rho_{c,d}$ are computed by substituting $I_d(t)$, $I_x(t)$, where $x \in \{a, b, c\}$, into Equation (11).

Then at step S22, the connection phase determination section 18 determines whether or not the correlation coefficient $\rho_{a,d}$ is the minimum out of the three types of correlation coefficient computed at step S20. If the correlation coefficient $\rho_{a,d}$ is the minimum, then processing transitions to step S24, and if the correlation coefficient $\rho_{a,d}$ is not the minimum, then processing transitions to step S26. At step S24, the connection phase determination section 18 determines whether or not the connection phase of the transformer indicated by the transformer ID received at step S10 is phase bc.

At step S26, determination is made as to whether or not the correlation coefficient $\rho_{b,d}$ is the minimum out of the three types of correlation coefficient computed at step S20. Processing transitions to step S28 if the correlation coefficient $\rho_{b,d}$ is the minimum, and processing transitions to step S30 if the correlation coefficient $\rho_{b,d}$ is not the minimum. At step S28, the connection phase determination section 18 determines if the connection phase of the transformer indicated by the transformer ID received at step S10 is the connection phase of the phase ca.

If processing has transitioned to step S30, namely if negative determination has been made at step S22 and step S26, then, since the correlation coefficient $\rho_{c,d}$ is the minimum, the connection phase determination section 18 determines that the connection phase of the transformer indicated by the transformer ID received at step S10 is the phase cd.

Then, at step S32, the output processing section 20 processes the determination result of step S24, S28 or S30, and outputs such as to display on a monitor, or to print by a printer. The determination result of step S24, S28 or S30 is made according to Equation (15).

As explained above, according to the transformer connection phase determination device 10 according to the present exemplary embodiment, the correlation coefficient is computed between the line currents of each of the power distribution lines on the high voltage side of the power distribution system, and the phase currents caused by the power consumption of the consumer connected to the transformer. The correlation coefficient is computed for each of the line types of the line currents, and even if only some of the consumers have usable data for power consumption, the one correlation coefficient present that has a smaller value compared to the others corresponds to the connection phase of the transformer. Hence even in cases in which there is only usable data for power consumption for some of the consumers connected to the transformer, determination of the connection phase of the transformer is still possible.

The data of the line current of each of the power distribution lines on the high voltage side of the power distribution system can be derived from the measurement values measured by the sensor containing switches. The data of power consumption in the consumers may employ measurement values measured by power meters with communication functions, such as smart meters, installed at the consumer. The connection phase of the transformer is thereby determinable by using merely the data measured by the sensor containing switches and the power meters with communication functions.

The correlation coefficients expressed by Equation (11) are merely an example thereof, and other values that are values indicating the correlation between the phase current and the line current may also be employed.

Explanation has been given above of a case in which the transformer connection phase determination program 50 is pre-stored (installed) in the storage section 46, however the transformer connection phase determination program 50 may be supplied in another format, such as recorded on a recording medium such as a CD-ROM, or a DVD-ROM.

An aspect of technology disclosed herein has the advantageous effect of enabling the connection phase of a transformer to be determined even when data of power consumption is only usable for some consumers connected to the transformer.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A transformer connection phase determination device, comprising:
  a memory; and
  a processor configured to execute a procedure, the procedure comprising:
    measuring a power consumed by at least one consumer connected to a transformer connected to one phase corresponding to a combination of two of a plurality of power distribution lines with a smart meter;
    measuring each of line currents flowing each of the plurality of power distribution lines with sensor containing switches disposed at two ends of a power distribution sector;
    computing respective correlation values representing a correlation between current corresponding to the power that has been measured and the each of line currents that has been measured;
    comparing the respective correlation values to determine a correlation value representing the lowest correlation, the correlation representing the lowest correlation corresponding to a phase corresponding to a combination of power distribution lines other than a power distribution line in which line current is flowing;

determining the phase to which the transformer is connected as the phase corresponding to the combination of power distribution lines; and outputting a determination result by an output device.

2. The transformer connection phase determination device of claim 1, wherein the procedure further comprises:

acquiring an amount of power consumed by the at least one consumer, and converting the acquired power amount into a current value.

3. The transformer connection phase determination device of claim 2, wherein, in the procedure:

when converting the power amount into a current value, in cases in which respective power amounts consumed by each of a plurality of consumers are acquired, the respective power amounts are added together, and treated as a power amount consumed by a single hypothetical consumer.

4. A transformer connection phase determination method, comprising:

measuring a power consumed by at least one consumer connected to a transformer connected to one phase corresponding to a combination of two of a plurality of power distribution lines with a smart meter;

measuring each of line currents flowing each of the plurality of power distribution lines with sensor containing switches disposed at two ends of a power distribution sector;

computing respective correlation values representing a correlation between current corresponding to the power that has been measured and the each of line currents that has been measured;

by a processor, comparing the respective correlation values to determine a correlation value representing the lowest correlation, the correlation representing the lowest correlation corresponding to a phase corresponding to a combination of power distribution lines other than a power distribution line in which line current is flowing;

by the processor, determining the phase to which the transformer is connected as the phase corresponding to the combination of power distribution lines; and outputting a determination result by an output device.

5. The transformer connection phase determination method of claim 4, further comprising:

acquiring an amount of power consumed by the at least one consumer, and converting the acquired power amount into a current value.

6. The transformer connection phase determination method of claim 5, wherein:

when converting the power amount into a current value, in cases in which respective power amounts consumed by each of a plurality of consumers are acquired, the respective power amounts are added together, and treated as a power amount consumed by a single hypothetical consumer.

7. A non-transitory computer readable medium storing a program that causes a computer to execute a transformer connection phase determination process, the process comprising:

measuring a power consumed by at least one consumer connected to a transformer connected to one phase corresponding to a combination of two of a plurality of power distribution lines with a smart meter;

measuring each of line currents flowing each of the plurality of power distribution lines with sensor containing switches disposed at two ends of a power distribution sector;

computing respective correlation values representing a correlation between current corresponding to the power that has been measured and the each of line currents that has been measured;

comparing the respective correlation values to determine a correlation value representing the lowest correlation, the correlation representing the lowest correlation corresponding to a phase corresponding to a combination of power distribution lines other than a power distribution line in which line current is flowing;

determining the phase to which the transformer is connected as the phase corresponding to the combination of power distribution lines; and outputting a determination result by an output device.

8. The non-transitory computer readable medium of claim 7, wherein the transformer connection phase determination procedure further comprises:

acquiring an amount of power consumed by the at least one consumer, and converting the acquired power amount into a current value.

9. The non-transitory computer readable medium of claim 8, wherein, in the transformer connection phase determination procedure:

when converting the power amount into a current value, in cases in which respective power amounts consumed by each of a plurality of consumers are acquired, the respective power amounts are added together, and treated as a power amount consumed by a single hypothetical consumer.

* * * * *